United States Patent
He et al.

(10) Patent No.: US 10,943,784 B2
(45) Date of Patent: Mar. 9, 2021

(54) METHOD FOR OPTIMIZING A CRITICAL DIMENSION FOR DOUBLE PATTERNING FOR NAND FLASH

(71) Applicant: Shanghai Huali Microelectronics Corporation, Shanghai (CN)

(72) Inventors: Li He, Shanghai (CN); Xiaohua Ju, Shanghai (CN); Guanqun Huang, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 16/684,918

(22) Filed: Nov. 15, 2019

(65) Prior Publication Data
US 2021/0020440 A1    Jan. 21, 2021

(30) Foreign Application Priority Data
Jul. 17, 2019 (CN) .......................... 201910643540.4

(51) Int. Cl.
*H01L 21/66* (2006.01)
*H01L 21/033* (2006.01)
(Continued)

(52) U.S. Cl.
CPC ...... *H01L 21/0337* (2013.01); *H01L 21/0332* (2013.01); *H01L 22/12* (2013.01);
(Continued)

(58) Field of Classification Search
CPC . H01L 21/0337; H01L 22/12; H01L 27/11578
See application file for complete search history.

(56) References Cited

U.S. PATENT DOCUMENTS

2013/0260557 A1 * 10/2013 Wang ................ H01L 27/11524
                                                  438/669
2016/0314970 A1 * 10/2016 Park .................... H01L 21/0337
(Continued)

FOREIGN PATENT DOCUMENTS

CN        103715068 A       4/2014
CN        104658939 A       5/2015
(Continued)

OTHER PUBLICATIONS

Dec. 29, 2020—CN CNIPA First Search Report Appn 201910643540.4.

*Primary Examiner* — George R. Fourson, III
(74) *Attorney, Agent, or Firm* — Banner & Witcoff, Ltd.

(57) ABSTRACT

The present invention provides a method for optimizing a critical dimension for double patterning for NAND flash, forming a core oxide layer on amorphous silicon layer on substrate; densifying the core oxide layer and etching it to form a core pattern; measuring CD values of the bottom and top of the core pattern; providing etching rates of a non-densified core oxide layer and a densified core oxide layer under the same etching condition; calculating the thickness of the core oxide layer required to be densified according to the CD values of the bottom and top of the core pattern and the etching rates to determine the densifying time. The present invention precisely controls the morphology and CD, and obtains a double-patterned target pattern with consistent CD sizes of a top and a bottom and a consistent bottom height, so as to improve a product yield.

15 Claims, 6 Drawing Sheets

(51) Int. Cl.
*H01L 27/115* (2017.01)
*H01L 21/311* (2006.01)
(52) U.S. Cl.
CPC ....... *H01L 27/115* (2013.01); *H01L 21/31111* (2013.01); *H01L 21/31116* (2013.01)

(56) References Cited

U.S. PATENT DOCUMENTS

| | | | |
|---|---|---|---|
| 2016/0365310 A1* | 12/2016 | Hung | H01L 21/32139 |
| 2018/0252998 A1* | 9/2018 | Ten Berge | G03F 1/72 |
| 2018/0314149 A1* | 11/2018 | Mulkens | G03F 7/7065 |
| 2019/0198404 A1* | 6/2019 | Kim | H01L 22/20 |
| 2020/0333267 A1* | 10/2020 | Ito | G01N 23/20008 |
| 2020/0363350 A1* | 11/2020 | Irie | G01N 23/2251 |

FOREIGN PATENT DOCUMENTS

| | | |
|---|---|---|
| CN | 104701158 A | 6/2015 |
| CN | 106601602 A | 4/2017 |
| CN | 106783557 A | 5/2017 |
| WO | 2010103506 A1 | 9/2010 |

* cited by examiner

METHOD FOR OPTIMIZING A CRITICAL DIMENSION FOR DOUBLE PATTERNING FOR NAND FLASH

CROSS REFERENCE TO RELATED APPLICATIONS

The present application claims priority to and the benefit of Chinese Patent Application No. 201910643540.4 filed on Jul. 17, 2019, the disclosure of which is incorporated herein by reference in its entirety as part of the present application.

FIELD OF THE INVENTION

The present invention relates to the field of semiconductor manufacturing, in particular to a method for optimizing a critical dimension for double patterning for NAND flash.

BACKGROUND OF THE INVENTION

When a 40 nm node emerges for two-dimensional plane NAND flash, in order to achieve a smaller critical dimension for storage cells, double patterning is adopted when storage area patterns are defined. This method is a conventional approach to reduce the critical dimension by half under a limit of exposure ability of a conventional lithography machine and is a key method to reduce the size of storage cells for flash products.

Double patterning is an advanced process which defines a critical dimension (CD) of a core by adopting photo-etching, reduces the core CD by half by adopting wet etching, and then grows silicon nitride on the two sides of the core ($SiO_2$ or amorphous silicon) with reduced a CD, then removes core materials by adopting wet etching, and finally realizes using silicon nitride as an etch stop layer.

The key of the process is to control a size and morphology of a core pattern. Ideally, top and bottom sizes for the CD are consistent, the two sides of the top are right-angled, and no etching loss exists. Limited by the etching process characteristic of a high aspect ratio, it is very difficult to achieve consistent CD sizes of the top and bottom of the core as defined by a dry etching process. Further, in the subsequent wet etching process, the upper half of the core is etched faster, and the lower half is etched slower, which makes significant numerical difference between the CDs of top and bottom, and a core with a smaller top and a larger bottom will lead to a phenomenon that a finally etched pattern has a bottom, one portion of which is high and the other portion is low, resulting in failure of read-write crossfeed in memories.

Therefore, a new method is needed to solve the above problems.

SUMMARY OF THE INVENTION

In view of the disadvantages described above of the prior art, the purpose of the present invention is to provide a method for optimizing a critical dimension for double patterning for NAND flash, to solve the problem of failure of read-write crossfeed in memories caused by that one portion of the bottom of an etched pattern is high and the other portion is low in the prior art.

In order to realize the above purposes and other related purposes, the present invention provides a method for optimizing a critical dimension for double patterning for NAND flash. The method at least comprises the following steps: step 1: providing a substrate with an amorphous silicon layer; step 2: forming a core oxide layer on the amorphous silicon layer on the substrate; step 3: densifying the core oxide layer; step 4: etching the core oxide layer to form a core pattern; step 5: measuring CD values of the bottom and top of the core pattern; step 6: providing etching rates of a non-densified core oxide layer and a densified core oxide layer under the same etching condition; and step 7: calculating the thickness of the core oxide layer required to be densified according to the CD values of the bottom and top of the core pattern and the etching rates, to determine the densifying time of the core oxide layer.

Preferably, in step 2, the core oxide layer is formed by growing on the amorphous silicon layer, and the core oxide layer is used for growing spacers to form a double-patterned pattern.

Preferably, the core oxide layer is a TEOS layer.

Preferably, in step 3, a method for densifying the core oxide layer is performed by adopting a sub-high temperature annealing method.

Preferably, in step 4, the core oxide layer is etched by adopting dry etching to form the core pattern.

Preferably, in step 6, the same etching condition is wet etching performed by adopting DHF or BHF.

Preferably, the method further comprises step 8: according to the densifying time of the core oxide layer determined in step 7, performing a double patterning process and wet etching to obtain a core thinned pattern with consistent CDs of the bottom and top.

Preferably, the CD value of the core thinned pattern is half of the average CD value of the core pattern.

Preferably, the double patterning process comprises the following steps: (1) providing a substrate with an amorphous silicon layer; (2) forming a core oxide layer on the amorphous silicon layer and performing sub-high temperature annealing for the core oxide layer according to the densifying time of the core oxide layer; (3) depositing an APF (Advanced Patterning Film) film on the core oxide layer, forming a dielectric antireflective layer on the APF film, and spin-coating photoresist on the dielectric antireflective layer; (4) performing exposure and development to the photoresist according to a layout; (5) etching the dielectric antireflective layer, the APF film and the core oxide layer along the developed photoresist pattern to obtain a core pattern; and (6) performing wet etching to the core pattern to obtain a core thinned pattern with consistent CDs of the bottom and top.

Preferably, a method for forming the dielectric antireflective layer on the APF film is chemical vapor deposition.

Preferably, the wet etchant in step (6) is DHF or BHF.

Preferably, an etch stop layer is further provided between the core oxide layer and the amorphous silicon layer.

Preferably, the substrate is a target layer forming a double-patterned pattern and the amorphous silicon layer is used as a hard mask for etching.

Preferably, the double patterning process further comprises the following steps: (7) forming spacers on the two sidewalls of the core thinned pattern; (8) performing photoetching and etching to remove the core thinned pattern and remain the spacers on the two sides of the core thinned pattern; (9) sequentially etching the etch stop layer and the amorphous silicon layer along the spacers to obtain an amorphous silicon line pattern; and (10) etching the substrate along the amorphous silicon line pattern to form the double-patterned pattern.

Preferably, the material of the spacers is silicon nitride.

As mentioned above, the method of optimizing a critical dimension for double patterning for NAND flash has the following beneficial effects: the present invention precisely controls the morphology and CD of the core pattern in the double patterning process employed for NAND flash in 40 nm and below –40 nm process nodes and finally obtains a double-patterned target pattern with consistent CD sizes of a top and a bottom and a consistent bottom height, so as to improve the product yield.

DESCRIPTION OF THE EMBODIMENTS

The embodiments of the present invention will be described below through specific examples, and one skilled in the art can easily understand other advantages and effects of the present invention according to the contents disclosed in the description. The present invention may also be implemented or applied by means of other different specific embodiments, and the details in the description may also be modified or changed without departing from the spirit of the present invention based on different viewpoints and applications.

Please refer to FIG. 1 to FIG. 4i. It should be noted that the drawings provided in the embodiments are only used for schematically describing the basic concept of the present invention, only illustrate the components related to the present invention, and are not drawn according to the number, shape and dimension of the components during actual implementation. The configuration, number and scale of each component during actual implementation may be freely changed, and the layout configuration of the components may be more complex.

Embodiment 1

Figure 1:
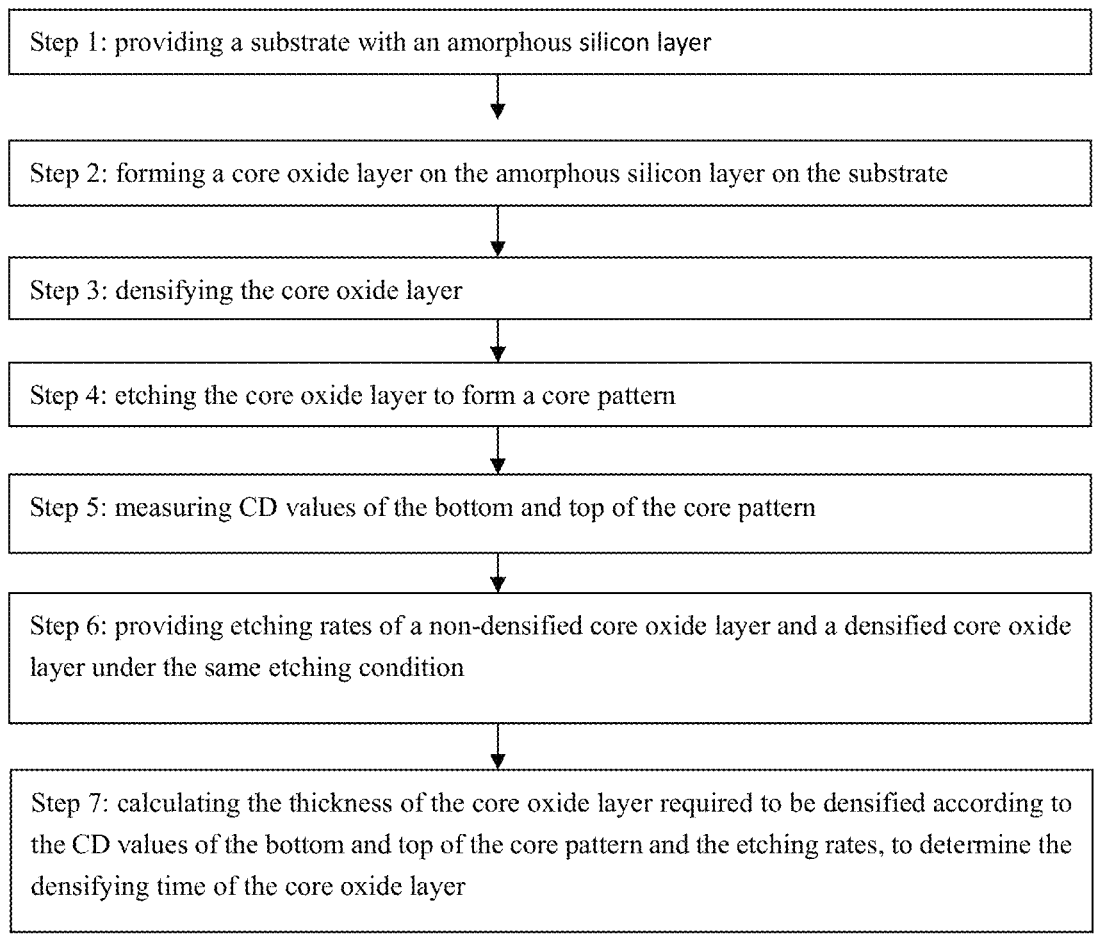
FIG. 1 illustrates a flowchart of a method for optimizing a critical dimension for double patterning for NAND flash according to the present invention.

As illustrated in FIG. 1, it illustrates a flowchart of a method for optimizing a critical dimension for double patterning for NAND flash according to the present invention. The present invention provides a method for optimizing a critical dimension for double patterning for NAND flash. In the present embodiment, the method comprises the following steps.

In step 1, a substrate with an amorphous silicon layer is provided. The amorphous silicon layer is formed on the substrate, the amorphous silicon layer is amorphous silicon, its particles are fine, and a formed pattern is good in structural morphology and is not rough.

Figure 2A:
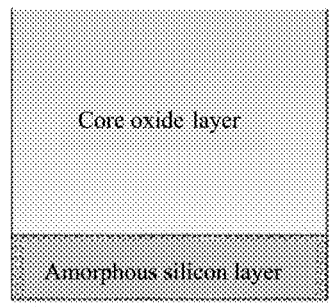
FIG. 2a illustrates a structural schematic view of forming a core oxide layer on an amorphous silicon layer in the present invention.

In step 2, a core oxide layer is formed on the amorphous silicon layer on the substrate. As illustrated in FIG. 2a, it illustrates a structural schematic view of forming a core oxide layer on an amorphous silicon layer in the present invention. In step 2 in the present embodiment, the core oxide layer is formed by growing on the amorphous silicon layer, and the core oxide layer is used for growing spacers to form a double-patterned pattern. In addition, the core oxide layer is a TEOS layer, and the core oxide layer is formed by growing on the amorphous silicon layer.

Figure 2B:
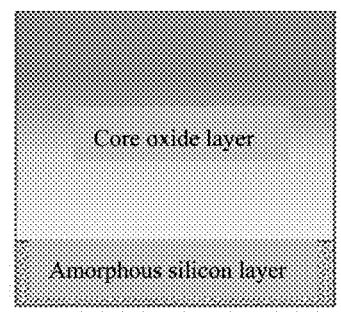
FIG. 2b illustrates a structural schematic view after densifying a core oxide layer in the present invention.

In step 3, the core oxide layer is densified. As illustrated in FIG. 2b, it illustrates a structural schematic view after densifying a core oxide layer in the present invention. In step 3 in the present embodiment, a method for densifying the core oxide layer is performed by adopting a sub-high temperature annealing method. After sub-high temperature heat treatment performed for the core oxide layer, the density of the top of the core oxide layer after annealing is relatively good, and the density of the bottom of the core oxide layer after annealing is relatively poor. The annealing temperature is lower than the annealing temperature of the implanted particles in a well region.

Figure 2C:
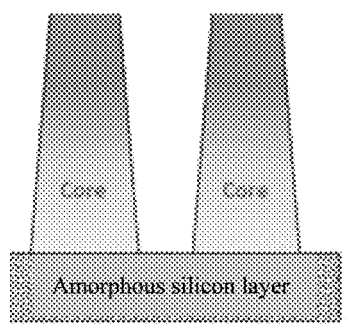
FIG. 2c illustrates a structural schematic view of etching a core oxide layer to form a core pattern in the present invention.

In step 4, the core oxide layer is etched to form a core pattern. In step 4 in the present embodiment, the core oxide layer is etched by adopting dry etching to form the core pattern. Due to the process characteristics that the dry etching for the core oxide layer is limited by the high aspect ratio, it is difficult to achieve the purpose that the CD sizes of the top and bottom of the obtained core pattern are consistent. As illustrated in FIG. 2c, it illustrates a structural schematic view of etching a core oxide layer to form a core pattern in the present invention. Therefore, the CD of the top of the obtained core pattern is smaller than the CD of the bottom.

In step 5, CD values of the bottom and top of the core pattern are measured. In this step, the CD values of the top and bottom of the obtained core pattern (a strip structure with a smaller top and a larger bottom in FIG. 2c) are recorded respectively.

Figure 3:
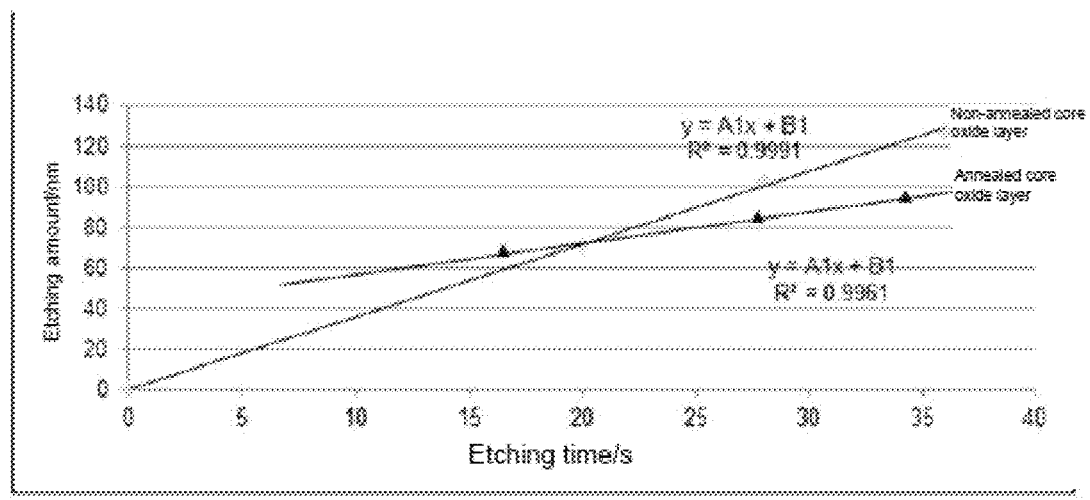
FIG. 3 illustrates etching rates of a non-densified core oxide layer and densified core oxide layer under use of BHF.

In step 6, etching rates of a non-densified core oxide layer and a densified core oxide layer under the same etching condition are provided. In step 6 in the present embodiment, the same etching condition is wet etching performed by adopting DHF or BHF. In this step, the provided etching rates of a non-densified core oxide layer and a densified core oxide layer under the same etching condition are usually obtained by collecting data for previous etching. As illustrated in FIG. 3, it illustrates etching rates of a non-densified core oxide layer and densified core oxide layer under use of BHF.

In step 7, the thickness of the core oxide layer required to be densified is calculated according to the CD values of the bottom and top of the core pattern and the etching rates, to determine densifying time of the core oxide layer. The densifying time of the core oxide layer is the time required for annealing the core oxide layer. The annealing time is strongly correlated with the thickness of the dense layer of the core oxide layer.

Figure 2D:
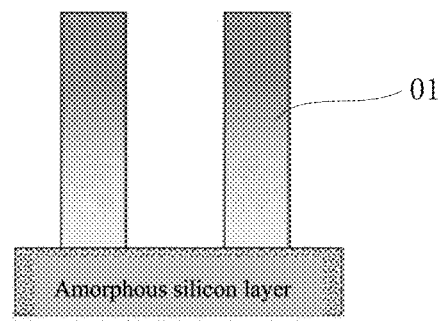
FIG. 2d illustrates a structural schematic view of forming a core thinned pattern in the present invention.

The method for optimizing a critical dimension for double patterning for NAND flash in the present embodiment further comprises step 8, in which according to the densifying time of the core oxide layer determined in step 7, a double patterning process and wet etching are performed to obtain a core thinned pattern with consistent CDs of the bottom and top. Because the density of the top of the core oxide layer subjected to densification (sub-high temperature annealing) is relatively good, the wet etching is relatively slow, while the density of the bottom is relatively poor, and the wet etching is relatively fast. Therefore, for the core pattern with a small CD of a top and a large CD of a bottom, after the core pattern is subjected to sub-high temperature treatment and then wet etching, a pattern with consistent CDs of the top and bottom can be obtained. Because the core pattern itself is subjected to the wet etching, the CD of the core pattern will shrink. Therefore, the CD of the final core thinned pattern will be smaller than the average CD value of the core pattern. As illustrated in FIG. 2d, it illustrates a structural schematic view of forming a core thinned pattern in the present invention. Further, in the present embodiment, the CD value of the core thinned pattern is half of the average CD value of the core pattern.

Embodiment 2

As illustrated in FIG. 1, it illustrates a flowchart of a method for optimizing a critical dimension for double patterning for NAND flash according to the present invention. The present invention provides a method for optimizing a critical dimension for double patterning for NAND flash. In the present embodiment, the method comprises the following steps.

In step 1, a substrate with an amorphous silicon layer is provided. The amorphous silicon layer is formed on the substrate, the amorphous silicon layer is amorphous silicon, its particles are fine, and a formed pattern is good in structural morphology and is not rough.

In step 2, a core oxide layer is formed on the amorphous silicon layer on the substrate. As illustrated in FIG. 2a, it illustrates a structural schematic view of forming a core oxide layer on an amorphous silicon layer in the present invention. In step 2 in the present embodiment, the core oxide layer is formed by growing on the amorphous silicon layer, and the core oxide layer is used for growing spacers to form a double-patterned pattern. In addition, the core oxide layer is a TEOS layer, and the core oxide layer is formed by growing on the amorphous silicon layer.

In step 3, the core oxide layer is densified. As illustrated in FIG. 2b, it illustrates a structural schematic view after densifying a core oxide layer in the present invention. In step 3 in the present embodiment, a method for densifying the core oxide layer is performed by adopting a sub-high temperature annealing method. After sub-high temperature heat treatment of the core oxide layer, the density of the top of the core oxide layer after annealing is relatively good, and the density of the bottom of the core oxide layer after annealing is relatively poor. The annealing temperature is lower than the annealing temperature of the implanted particles in the well region.

In step 4, the core oxide layer is etched to form a core pattern. In step 4 in the present embodiment, the core oxide layer is etched by adopting dry etching to form the core pattern. Due to the process characteristics that the dry etching of the core oxide layer is limited by the high aspect ratio, it is difficult to achieve the purpose that the CD sizes of the top and bottom of the obtained core pattern are consistent. As illustrated in FIG. 2c, it illustrates a structural schematic view of etching a core oxide layer to form a core pattern in the present invention. Therefore, the CD of the top of the obtained core pattern is smaller than the CD of the bottom.

In step 5, CD values of the bottom and top of the core pattern are measured. In this step, the CD values of the top and bottom of the obtained core pattern (a strip structure with a smaller top and a larger bottom in FIG. 2c) are recorded respectively.

In step 6, etching rates of a non-densified core oxide layer and a densified core oxide layer under the same etching condition are provided. In step 6 in the present embodiment, the same etching condition is wet etching performed by adopting DHF or BHF. In this step, the provided etching rates of a non-densified core oxide layer and a densified core oxide layer under the same etching condition are usually obtained by collecting data for previous etching. As illustrated in FIG. 3, it illustrates etching rates of a non-densified core oxide layer and densified core oxide layer under use of BHF.

In step 7, the thickness of the core oxide layer required to be densified is calculated according to the CD values of the bottom and top of the core pattern and the etching rates, to determine the densifying time of the core oxide layer. The densifying time of the core oxide layer is the time required for annealing the core oxide layer. The annealing time is strongly correlated with the thickness of the dense layer of the core oxide layer.

The method for optimizing a critical dimension for double patterning for NAND flash in the present embodiment further comprises step 8, in which according to the densifying time of the core oxide layer determined in step 7, a double patterning process and wet etching are performed to obtain a core thinned pattern with consistent CDs of the bottom and top. Because the density of the top of the core oxide layer subjected to densification (sub-high temperature annealing) is relatively good, the wet etching is relatively slow, while the density of the bottom is relatively poor, and the wet etching is relatively fast. Therefore, for the core pattern with a small CD of the top and a large CD of the bottom, after the core pattern is subjected to sub-high temperature treatment and then wet etching, a pattern with consistent CDs of the top and bottom can be obtained. Because the core pattern itself is subjected to the wet etching, the CD of the core pattern will shrink. Therefore, the CD of the final core thinned pattern will be smaller than the average CD value of the core pattern. As illustrated in FIG. 2d, it illustrates a structural schematic view of forming a core thinned pattern in the present invention. Further, in the present embodiment, the CD value of the core thinned pattern is half of the average CD value of the core pattern.

The double patterning process in step 8 of the present embodiment comprises the following steps.

(1) A substrate with an amorphous silicon layer is provided. The amorphous silicon layer is formed on the substrate, the amorphous silicon layer is amorphous silicon, its particles are fine, and a formed pattern is good in structural morphology and is not rough. In the present embodiment, the substrate is a target layer forming a double-patterned pattern and the amorphous silicon layer is used as a hard mask for etching.

(2) A core oxide layer is formed on the amorphous silicon layer and sub-high temperature annealing is performed for the core oxide layer according to the densifying time of the core oxide layer. The core oxide layer is used for growing spacers to form a double-patterned pattern. In addition, the core oxide layer is a TEOS layer. The core oxide layer is formed by growing on the amorphous silicon layer. The temperature of sub-high temperature annealing is lower than the annealing temperature of the implanted particles in the well region. In the present embodiment, an etch stop layer is further provided between the core oxide layer and the amorphous silicon layer.

(3) An APF film is deposited on the core oxide layer, a dielectric antireflective layer (DARC) is formed on the APF film, and photoresist is spin-coated on the dielectric antireflective layer. In the present embodiment, a method for forming the dielectric antireflective layer on the APF film is chemical vapor deposition.

(4) Exposure and development are performed to the photoresist according to a layout. The developed photoresist is used as a pattern for subsequent etching.

(5) The dielectric antireflective layer (DARC), the APF film and the core oxide layer are etched along the developed photoresist pattern to obtain a core pattern. The core oxide layer is etched by adopting dry etching to form the core pattern. Due to the process characteristics that the dry etching of the core oxide layer is limited by the high aspect ratio, the value of the CD of the top of the obtained core pattern is smaller than the value of the CD of the bottom.

(6) Wet etching is performed to the core pattern to obtain a core thinned pattern with consistent CDs of the bottom and top. In this step, the wet etchant is DHF or BHF. Because the CD of the core pattern presents a morphology that the top is small and the bottom is large, and after sub-high temperature annealing of the core pattern, the density of the top is relatively good and the density of the bottom is relatively poor, it is necessary to uniformly etch the core pattern from top to bottom by wet etching. The CDs of the top and bottom of the core pattern subjected to wet etching are reduced. However, for the reason that the density of the top is good, the etching rate of the top is small, the density of the bottom is relatively poor, so the bottom etching rate is relatively large, and finally after the wet etching, a core thinned pattern with consistent CDs of the top and bottom is presented. Therefore, it overcomes the defect that the top of the core thinned pattern is small and the bottom is large in conventional core thinned pattern.

Embodiment 3

As illustrated in FIG. 1, it illustrates a flowchart of a method for optimizing a critical dimension for double patterning for NAND flash according to the present invention. The present invention provides a method for optimizing a critical dimension for double patterning for NAND flash. In the present embodiment, the method comprises the following steps.

In step 1, a substrate with an amorphous silicon layer is provided. The amorphous silicon layer is formed on the substrate, the amorphous silicon layer is amorphous silicon, its particles are fine, and a formed pattern is good in structural morphology and is not rough.

In step 2, a core oxide layer is formed on the amorphous silicon layer on the substrate. As illustrated in FIG. 2a, it illustrates a structural schematic view of forming a core oxide layer on an amorphous silicon layer in the present invention. In step 2 in the present embodiment, the core oxide layer is formed by growing on the amorphous silicon layer, and the core oxide layer is used for growing spacers to form a double-patterned pattern. In addition, the core oxide layer is a TEOS layer, and the core oxide layer is formed by growing on the amorphous silicon layer.

In step 3, the core oxide layer is densified. As illustrated in FIG. 2b, it illustrates a structural schematic view after densifying a core oxide layer in the present invention. In step 3 in the present embodiment, a method for densifying the core oxide layer is performed by adopting a sub-high temperature annealing method. After sub-high temperature heat treatment of the core oxide layer, the density of the top of the core oxide layer after annealing is relatively good, and the density of the bottom of the core oxide layer after annealing is relatively poor. The annealing temperature is lower than the annealing temperature of the implanted particles in the well region.

In step 4, the core oxide layer is etched to form a core pattern. In step 4 in the present embodiment, the core oxide layer is etched by adopting dry etching to form the core pattern. Due to the process characteristics that the dry etching of the core oxide layer is limited by the high aspect ratio, it is difficult to achieve the purpose that the CD sizes of the top and bottom of the obtained core pattern are consistent. As illustrated in FIG. 2c, it illustrates a structural schematic view of etching a core oxide layer to form a core pattern in the present invention. Therefore, the CD of the top of the obtained core pattern is smaller than the CD of the bottom.

In step 5, CD values of the bottom and top of the core pattern are measured. In this step, the CD values of the top and bottom of the obtained core pattern (a strip structure with a smaller top and a larger bottom in FIG. 2c) are recorded respectively.

In step 6, etching rates of a non-densified core oxide layer and a densified core oxide layer under the same etching condition are provided. In step 6 in the present embodiment, the same etching condition is wet etching performed by adopting DHF or BHF. In this step, the provided etching rates of a non-densified core oxide layer and a densified core oxide layer under the same etching condition are usually obtained by collecting data for previous etching. As illustrated in FIG. 3, it illustrates etching rates of a non-densified core oxide layer and densified core oxide layer under use of BHF.

In step 7, the thickness of the core oxide layer required to be densified is calculated according to the CD values of the bottom and top of the core pattern and the etching rates, to determine the densifying time of the core oxide layer. The densifying time of the core oxide layer is the time required for annealing the core oxide layer. The annealing time is strongly correlated with the thickness of the dense layer of the core oxide layer.

The method for optimizing a critical dimension for double patterning for NAND flash in the present embodiment further comprises step 8, in which according to the densifying time of the core oxide layer determined in step 7, a double patterning process and wet etching are performed to obtain a core thinned pattern with consistent CDs of the bottom and top. Because the density of the top of the core oxide layer subjected to densification (sub-high temperature annealing) is relatively good, the wet etching is relatively slow, while the density of the bottom is relatively poor, and the wet etching is relatively fast. Therefore, for the core pattern with a small CD of the top and a large CD of the bottom, after sub-high temperature treatment and then wet etching, a pattern with consistent CDs of the top and bottom can be obtained. Because the core pattern itself is subjected to the wet etching, the CD of the core pattern will shrink. Therefore, the CD of the final core thinned pattern will be smaller than the average CD value of the core pattern. As illustrated in FIG. 2d, it illustrates a structural schematic view of forming a core thinned pattern in the present invention. Further, in the present embodiment, the CD value of the core thinned pattern is half of the average CD value of the core pattern.

Refer FIG. 4a to FIG. 4i, which illustrate schematic views of structures formed in each step of a double patterning process according to the present invention. The double patterning process in step 8 of the present embodiment comprises the following steps:

(1) a substrate 02 with an amorphous silicon layer 03 is provided. The amorphous silicon layer is formed on the substrate, the amorphous silicon layer is amorphous silicon, its particles are fine, and the formed pattern is good in structural morphology and is not rough. In the present embodiment, the substrate is a target layer forming a double-patterned pattern and the amorphous silicon layer is used as a hard mask for etching.

(2) A core oxide layer 01 is formed on the amorphous silicon layer 03 and sub-high temperature annealing is performed for the core oxide layer according to the densifying time of the core oxide layer. The core oxide layer is used for growing spacers to form a double-patterned pattern. In addition, the core oxide layer is a TEOS layer. The core oxide layer is formed by growing on the amorphous silicon layer. The temperature of sub-high temperature annealing is lower than the annealing temperature of the implanted particles in the well region. In the present embodiment, an etch stop layer 04 is further provided between the core oxide layer and the amorphous silicon layer.

(3) An APF film 05 is deposited on the core oxide layer, a dielectric antireflective layer DARC (not shown) is formed on the APF film, and photoresist 06 is spin-coated on the dielectric antireflective layer. In the present embodiment, a method for forming the dielectric antireflective layer on the APF film is chemical vapor deposition.

(4) Exposure and development are performed to the photoresist according to a layout. The developed photoresist is used as a pattern for subsequent etching.

(5) The dielectric antireflective layer (DARC), the APF film and the core oxide layer are etched along the developed photoresist pattern to obtain a core pattern. The core oxide layer is etched by adopting dry etching to form the core pattern. Due to the process characteristics that the dry etching of the core oxide layer is limited by the high aspect ratio, the value of the CD of the top of the obtained core pattern is smaller than the value of the CD of the bottom.

(6) Wet etching is performed to the core pattern to obtain a core thinned pattern with consistent CDs of the bottom and top. In this step, the wet etchant is DHF or BHF. Because the CD of the core pattern presents a morphology that the top is small and the bottom is large, and after sub-high temperature annealing of the core pattern, the density of the top is relatively good and the density of the bottom is relatively poor, it is necessary to uniformly etch the core pattern from top to bottom by wet etching. The CDs of the top and bottom of the core pattern subjected to wet etching are reduced. However, for the reason that the density of the top is good, the etching rate of the top is small, the density of the bottom is relatively poor, so the bottom etching rate is relatively large, and finally after the wet etching, a core thinned pattern with consistent CDs of the top and bottom is presented. Therefore, it overcomes the defect that the top of the core thinned pattern is small and the bottom is large in the past.

Figure 4A:
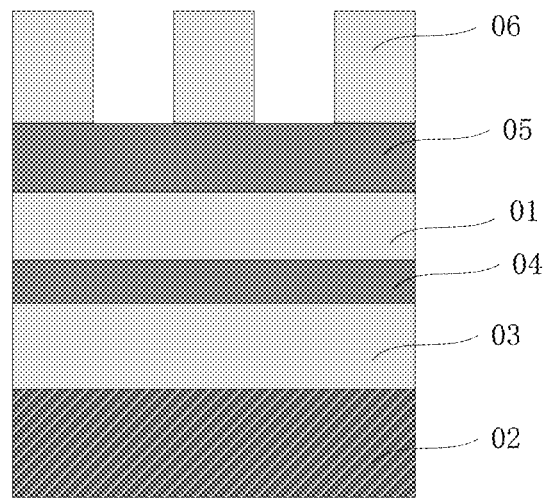
FIG. 4a to FIG. 4i illustrate schematic views of structures formed in each step of a double patterning process according to the present invention.
Figure 4B:
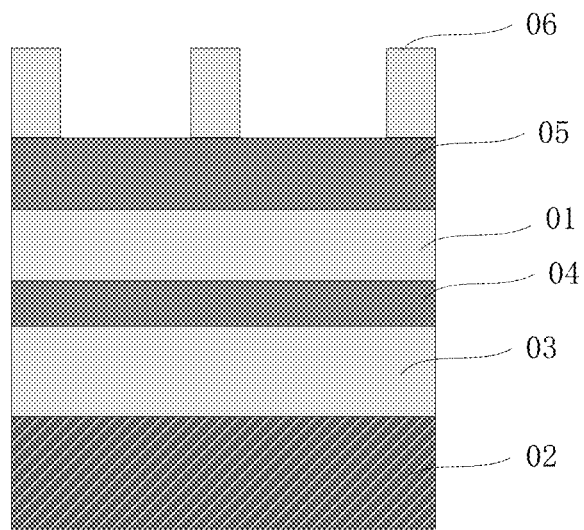
Figure 4C:
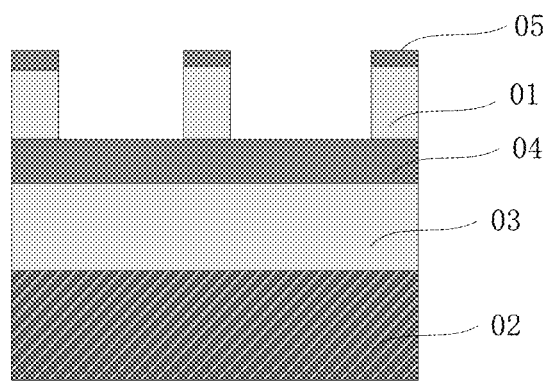
Figure 4D:
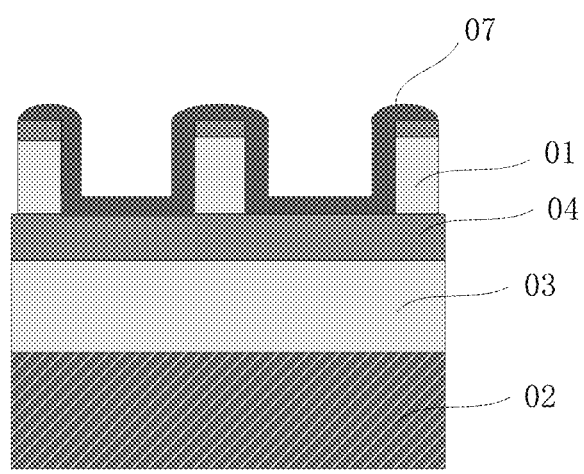
Figure 4E:
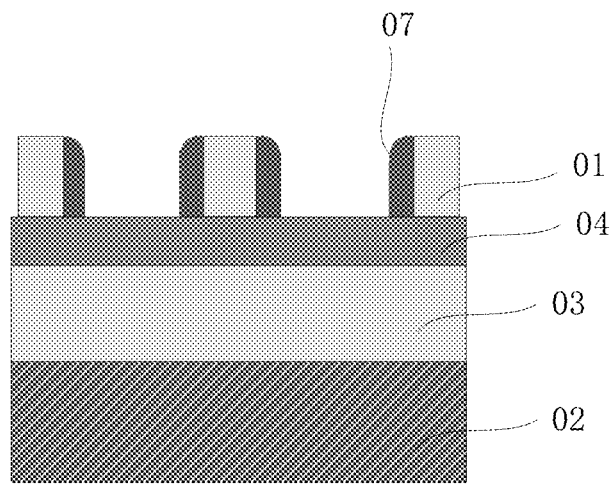
Figure 4F:
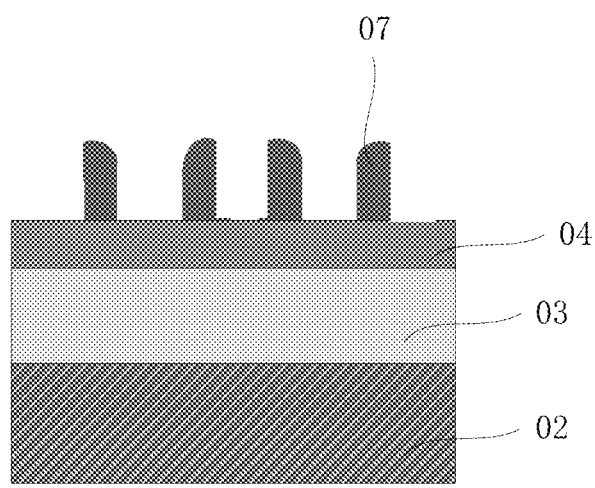
Figure 4G:
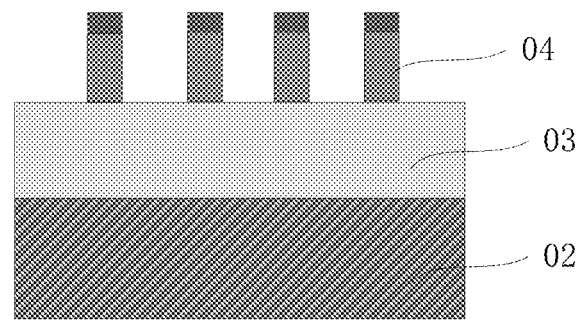
Figure 4H:
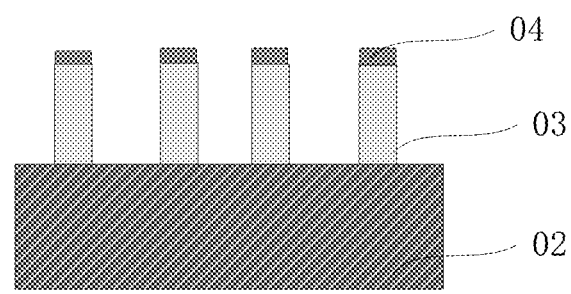
Figure 4I:
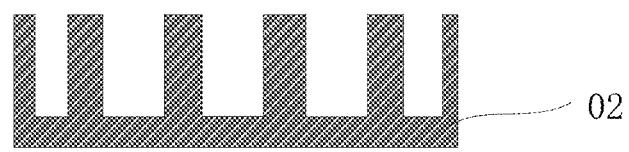

As illustrated in FIG. 4e, the double patterning process in the present embodiment further comprises the following steps: (7) spacers 07 are formed on the two sidewalls of the core thinned pattern. In the present embodiment, the material of the spacers is silicon nitride; (8) as illustrated in FIG. 4f, photoetching and etching are performed to remove the core thinned pattern and remain the spacers on the two sides of the core thinned pattern; (9) as illustrated in FIG. 4g and FIG. 4h, the etch stop layer and the amorphous silicon layer are sequentially etched along the spacers to obtain an amorphous silicon line pattern; and (10) as illustrated in FIG. 4i, the substrate is etched along the amorphous silicon line pattern to form the double-patterned pattern.

To sum up, the present invention precisely controls the morphology and CD of the core pattern in the double patterning process performed for NAND flash in 40 nm and below −40 nm process nodes and finally obtains a double-patterned target pattern with consistent CD sizes of a top and a bottom and a consistent bottom height, so as to improve the product yield. Therefore, the present invention effectively overcomes various disadvantages in the prior art and has a great industrial utilization value.

The above embodiments are only used for exemplarily describing the principle and effects of the present invention instead of limiting the present invention. One skilled in the art may modify or change the above embodiments without departing from the spirit and scope of the present invention. Therefore, all equivalent modifications or changes made by one skilled in the art without departing from the spirit and technical concept disclosed by the present invention shall be covered by the claims of the present invention.

What is claimed is:

1. A method for optimizing a critical dimension for double patterning for NAND flash, wherein the method at least comprises the following steps:
   step 1: providing a substrate with an amorphous silicon layer;
   step 2: forming a core oxide layer on the amorphous silicon layer on the substrate;
   step 3: densifying the core oxide layer;
   step 4: etching the core oxide layer to form a core pattern;
   step 5: measuring CD values of the bottom and top of the core pattern;
   step 6: providing etching rates of a non-densified core oxide layer and a densified core oxide layer under the same etching condition; and
   step 7: calculating the thickness of the core oxide layer required to be densified according to the CD values of the bottom and top of the core pattern and the etching rates, to determine the densifying time of the core oxide layer.

2. The method for optimizing a critical dimension for double patterning for NAND flash according to claim 1, wherein, in step 2, the core oxide layer is formed by growing on the amorphous silicon layer, and the core oxide layer is used for growing spacers to form a double-patterned pattern.

3. The method for optimizing a critical dimension for double patterning for NAND flash according to claim 1, wherein the core oxide layer is a TEOS layer.

4. The method for optimizing a critical dimension for double patterning for NAND flash according to claim 1, wherein, in step 3, a method for densifying the core oxide layer is performed by adopting a sub-high temperature annealing method.

5. The method for optimizing a critical dimension for double patterning for NAND flash according to claim 1, wherein, in step 4, the core oxide layer is etched by adopting dry etching to form the core pattern.

6. The method for optimizing a critical dimension for double patterning for NAND flash according to claim 1, wherein, in step 6, the same etching condition is wet etching performed by adopting DHF or BHF.

7. The method for optimizing a critical dimension for double patterning for NAND flash according to claim 4, wherein the method further comprises step 8: according to the densifying time of the core oxide layer determined in step 7, performing a double patterning process and wet etching to obtain a core thinned pattern with consistent CDs of the bottom and top.

8. The method for optimizing a critical dimension for double patterning for NAND flash according to claim 7, wherein the CD value of the core thinned pattern is half of the average CD value of the core pattern.

9. The method for optimizing a critical dimension for double patterning for NAND flash according to claim 7, wherein the double patterning process comprises the following steps:
(1) providing a substrate with an amorphous silicon layer; (2) forming a core oxide layer on the amorphous silicon layer and performing sub-high temperature annealing for the core oxide layer according to the densifying time of the core oxide layer; (3) depositing an APF film on the core oxide layer, forming a dielectric antireflective layer on the APF film, and spin-coating photoresist on the dielectric antireflective layer; (4) performing exposure and development to the photoresist according to a layout; (5) etching the dielectric antireflective layer, the APF film and the core oxide layer along the developed photoresist pattern to obtain a core pattern; and (6) performing wet etching to the core pattern to obtain a core thinned pattern with consistent CDs of the bottom and top.

10. The method for optimizing a critical dimension for double patterning for NAND flash according to claim 9, wherein a method for forming the dielectric antireflective layer on the APF film is chemical vapor deposition.

11. The method for optimizing a critical dimension for double patterning for NAND flash according to claim 10, wherein the wet etchant in step (6) is DHF or BHF.

12. The method for optimizing a critical dimension for double patterning for NAND flash according to claim 11, wherein an etch stop layer is further provided between the core oxide layer and the amorphous silicon layer.

13. The method for optimizing a critical dimension for double patterning for NAND flash according to claim 12, wherein the substrate is a target layer forming a double-patterned pattern and the amorphous silicon layer is used as a hard mask for etching.

14. The method for optimizing a critical dimension for double patterning for NAND flash according to claim 13, wherein the double patterning process further comprises the following steps: (7) forming spacers on the two sidewalls of the core thinned pattern; (8) performing photoetching and etching to remove the core thinned pattern and remain the spacers on the two sides of the core thinned pattern; (9) sequentially etching the etch stop layer and the amorphous silicon layer along the spacers to obtain an amorphous silicon line pattern; and (10) etching the substrate along the amorphous silicon line pattern to form the double-patterned pattern.

15. The method for optimizing a critical dimension for double patterning for NAND flash according to claim 14, wherein the material of the spacers is silicon nitride.

\* \* \* \* \*